US012713956B2

(12) United States Patent
Chang

(10) Patent No.: US 12,713,956 B2
(45) Date of Patent: Aug. 18, 2026

(54) PICK AND PLACE METHOD WITH DETECTING AN EVENT

(71) Applicant: TAIWAN SEMICONDUCTOR MANUFACTURING COMPANY LTD., Hsinchu (TW)

(72) Inventor: Jen-Yuan Chang, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 606 days.

(21) Appl. No.: 17/813,949

(22) Filed: Jul. 21, 2022

(65) Prior Publication Data

US 2023/0025157 A1 Jan. 26, 2023

Related U.S. Application Data

(60) Provisional application No. 63/225,432, filed on Jul. 23, 2021.

(51) Int. Cl.

| | |
|---|---|
| ***H10W 72/00*** | (2026.01) |
| ***B25J 15/06*** | (2006.01) |
| *B25J 11/00* | (2006.01) |
| *H10W 72/90* | (2026.01) |
| *H10W 80/00* | (2026.01) |

(52) U.S. Cl.

CPC ....... *H10W 72/011* (2026.01); *B25J 15/0616* (2013.01); *B25J 11/0095* (2013.01); *H10W 72/90* (2026.01); *H10W 80/301* (2026.01); *H10W 80/312* (2026.01); *H10W 80/327* (2026.01)

(58) Field of Classification Search

CPC ............... B25J 15/0616; B25J 11/0095; H01L 21/67144; H10W 72/011; H10W 72/90; H10W 80/301; H10W 80/312; H10W 80/327; H10P 72/0446

See application file for complete search history.

(56) References Cited

U.S. PATENT DOCUMENTS

2004/0023466 A1* 2/2004 Yamauchi ......... H01L 21/67294 257/E21.705
2013/0068823 A1* 3/2013 Maki ....................... H01L 24/75 228/49.5
2021/0407830 A1* 12/2021 Ahn .................... H01L 21/6838

* cited by examiner

*Primary Examiner* — Gerald McClain
(74) *Attorney, Agent, or Firm* — WPAT LAW; Anthony King

(57) ABSTRACT

A pick and place method includes providing at least one semiconductor element disposed on a source storage location, picking up the at least one semiconductor element from the source storage location, transferring the at least one semiconductor element to a temporary storage device according to a signal, positioning the at least one semiconductor element via the temporary storage device, and picking up the positioned semiconductor element from the temporary storage device and placing the positioned semiconductor element on a destination storage location.

20 Claims, 18 Drawing Sheets

1
A
12
32
34
3
31
33
32
15
8
11
S
14
A

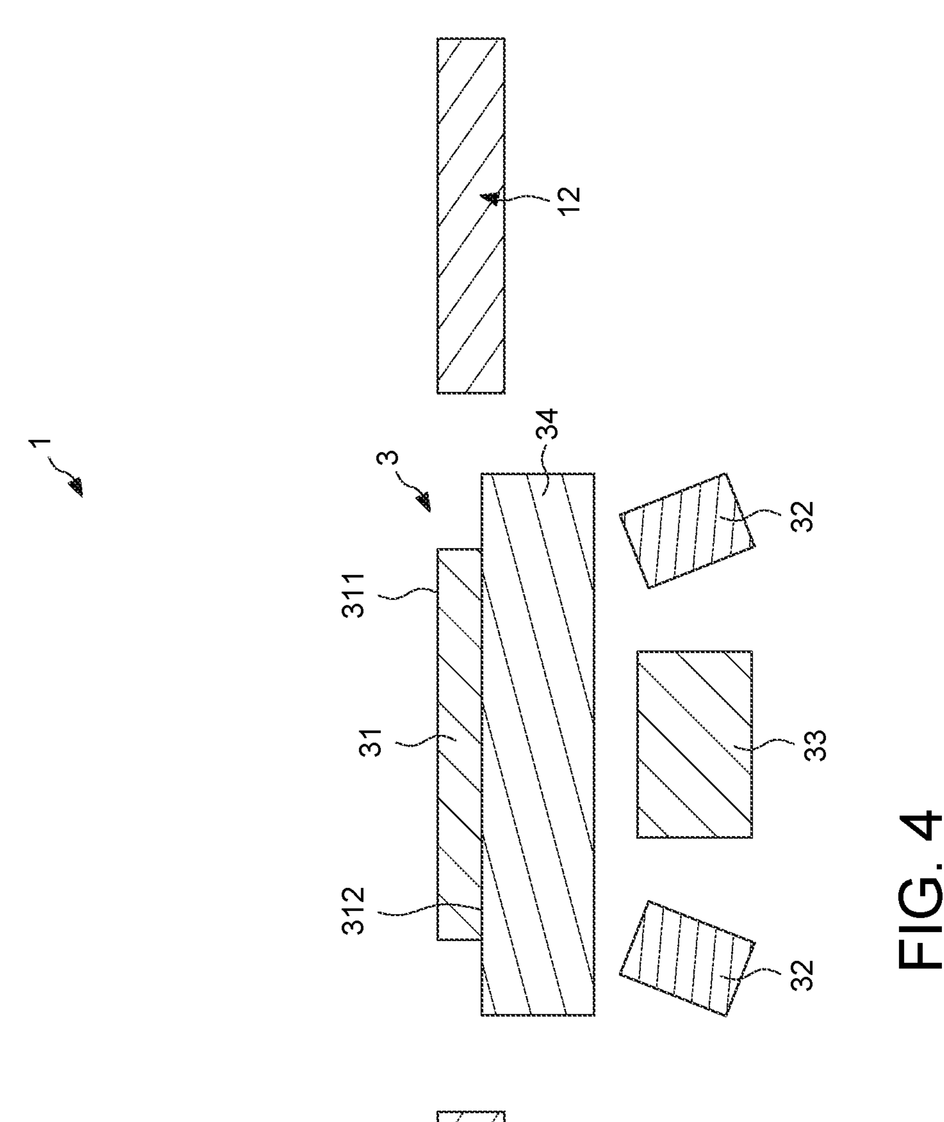
FIG. 4
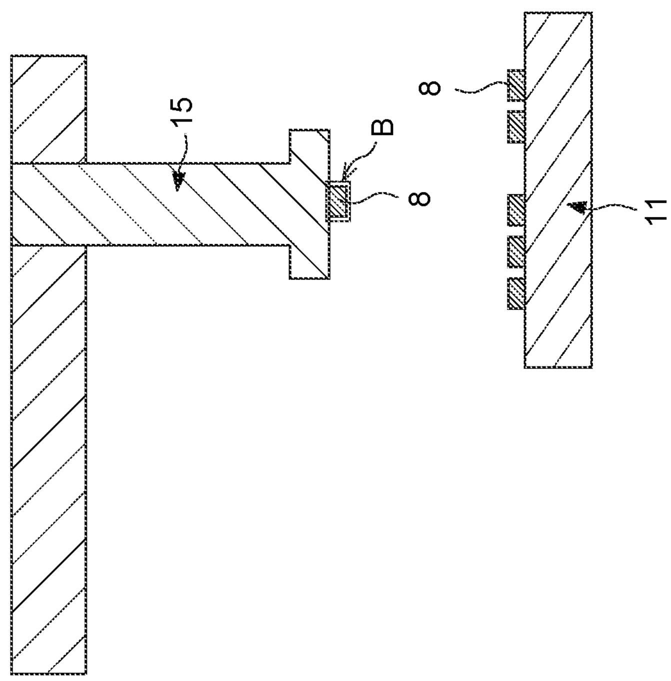

PICK AND PLACE METHOD WITH DETECTING AN EVENT

CROSS-REFERENCE TO RELATED APPLICATIONS

This application claims the benefit of U.S. Provisional Application No. 63/225,432, filed Jul. 23, 2021, the entire disclosure of which is incorporated by reference herein.

BACKGROUND

System on integrated chips (SoICs) are known to be fabricated using hybrid die-to-die bonding processes. To achieve well bonding between the dice, pick and place processes require extreme precision to prevent misalignment between the dice. Therefore, when the pick and place processes are disturbed, the picked die must be scrapped because the picked die cannot be accurately realigned, resulting in decreased manufacturing yield.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 4 illustrates a cross-sectional view of one or more stages of an example of a pick and place method according to some embodiments of the present disclosure.

DETAILED DESCRIPTION

Figure 1:
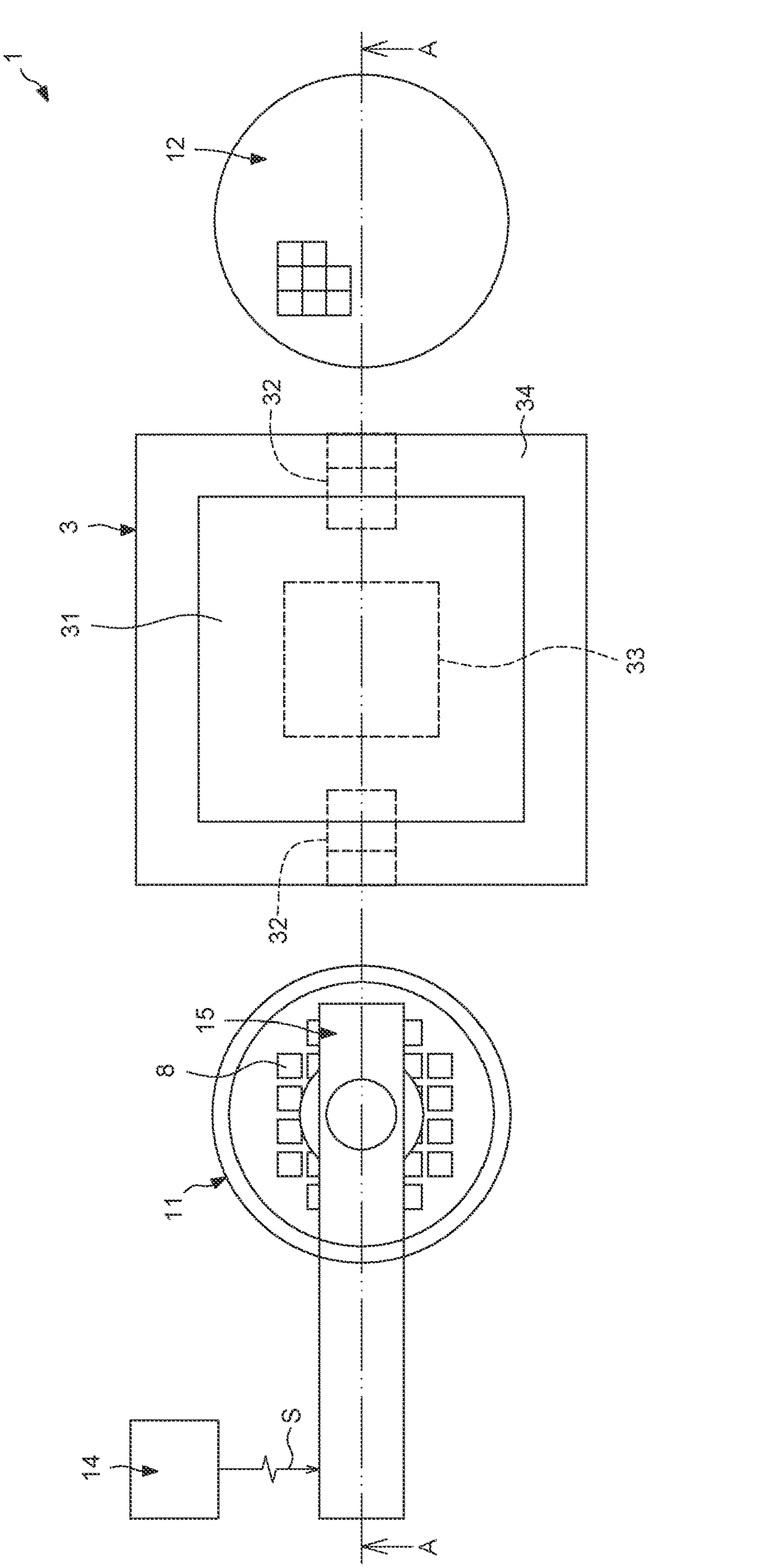
FIG. 1 illustrates a top view of an example of a pick and place apparatus according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Figure 2:
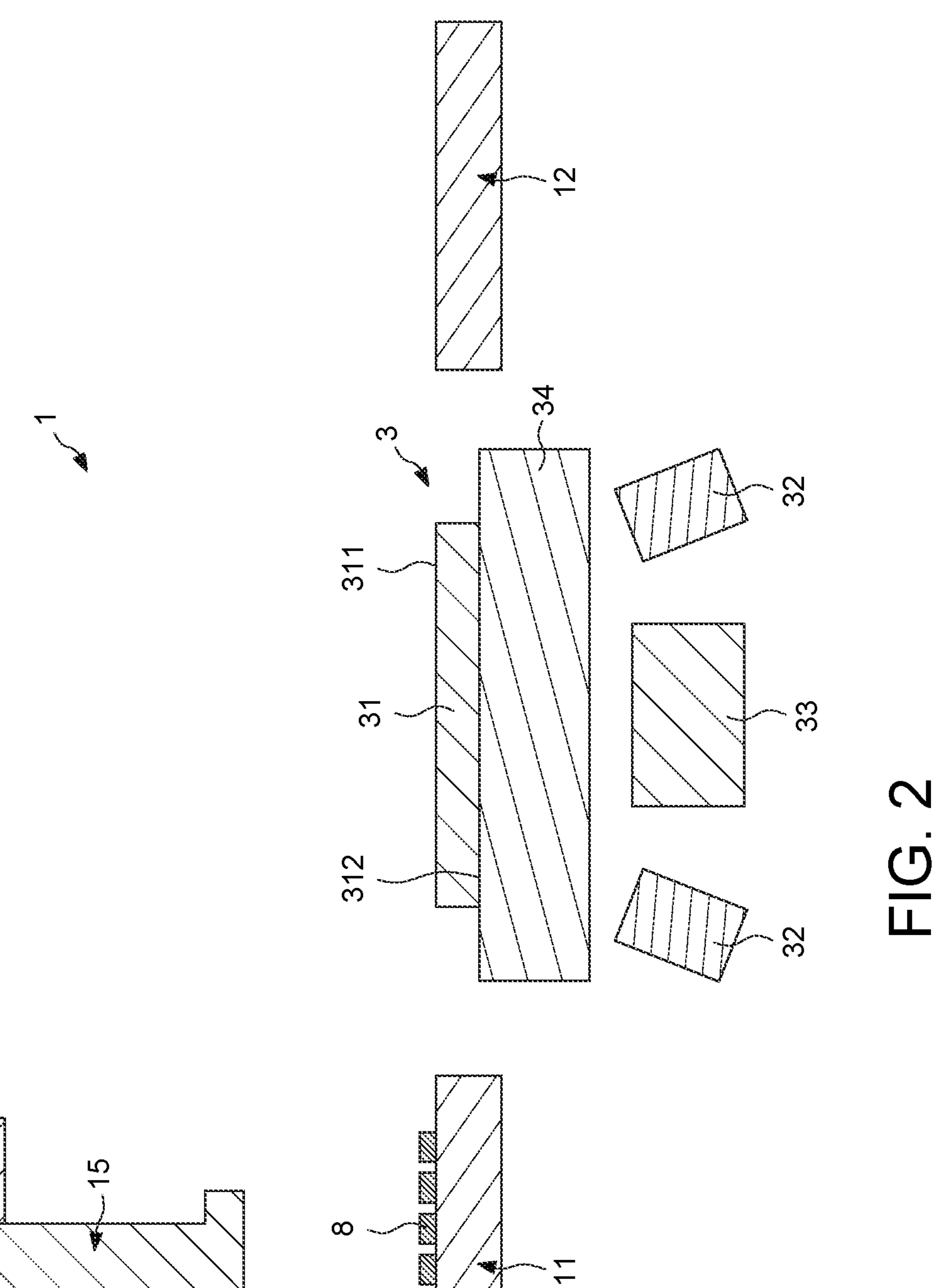
FIG. 2 illustrates a cross-sectional view along line A-A of FIG. 1.
Figure 3:
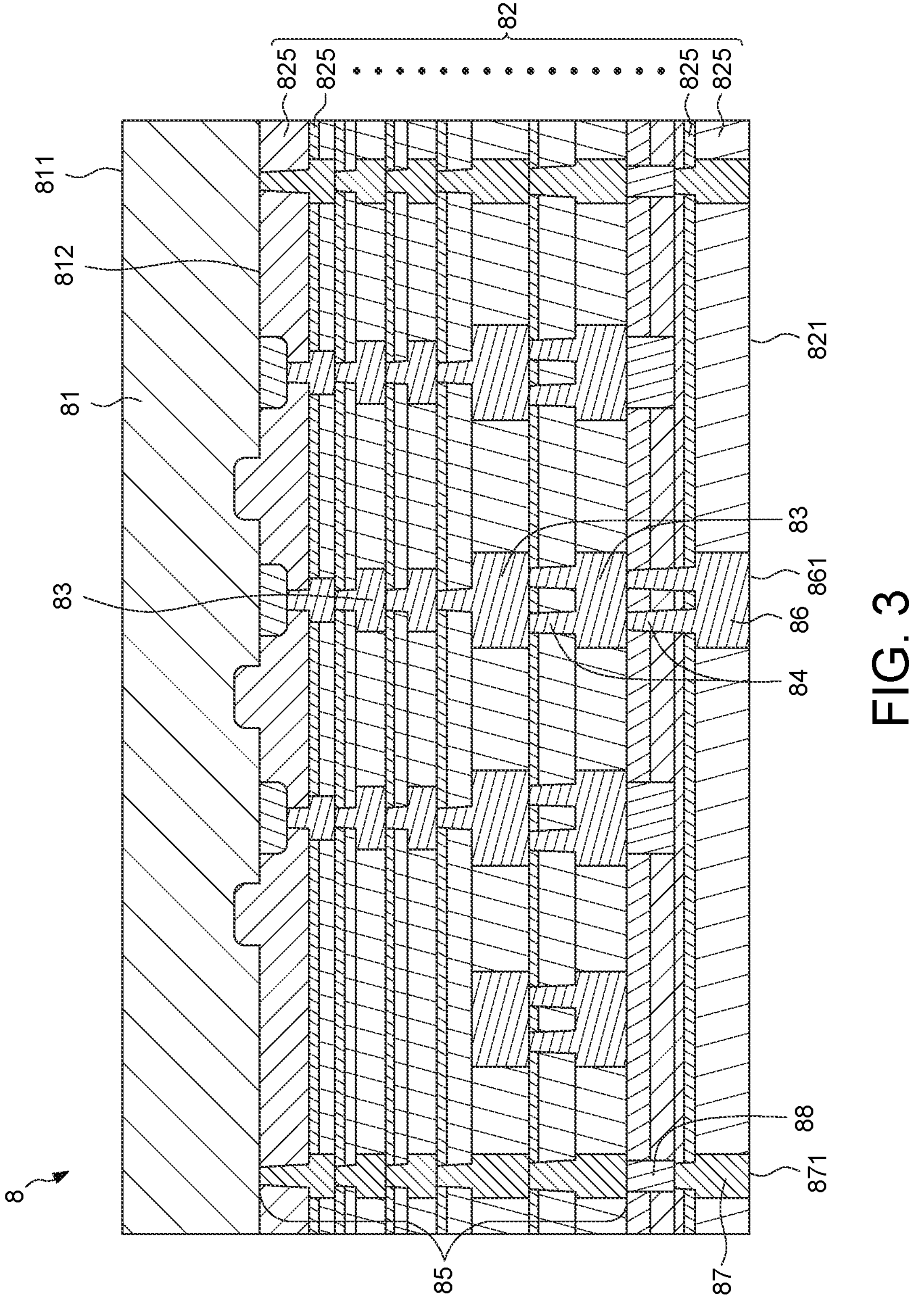
FIG. 3 illustrates a schematic view of an example of a semiconductor element according to some embodiments of the present disclosure.

FIG. 1 through FIG. 12 illustrate a pick and place method according to some embodiments of the present disclosure. Referring to FIG. 1 through FIG. 3, at least one semiconductor element 8 and a pick and place apparatus 1 are provided. FIG. 1 illustrates top views of the semiconductor element 8 and the pick and place apparatus 1 according to some embodiments of the present disclosure. FIG. 2 illustrates a cross-sectional view along line A-A of FIG. 1. FIG. 3 illustrates a schematic view of a semiconductor element 8 according to some embodiments of the present disclosure. The at least one semiconductor element 8 can be, for example, semiconductor die or semiconductor chip. The pick and place apparatus 1 is configured to transfer the at least one semiconductor element 8.

In some embodiments, as shown in FIG. 3, the at least one semiconductor element 8 can include a substrate 81, a dielectric structure 82, at least one circuit layer 83, a plurality of inner vias 84, a first sealing structure 85, at least one bonding pad 86, a second sealing structure 87 and at least one conductive pad 88. The substrate 81 can be, for example, silicon substrate. The substrate 81 has a first surface 811 (e.g., a top surface) and a second surface 812 (e.g., a bottom surface) opposite to the first surface 811.

The dielectric structure 82 is located over the second surface 812 of the substrate 81. In some embodiments, as shown in FIG. 3, the dielectric structure 82 can include a plurality of dielectric layers 825. The dielectric layers 825 are stacked on one another.

The at least one circuit layer 83 is embedded in the dielectric structure 82 (including, for example, the plurality of dielectric layers 825). In some embodiments, the at least one circuit layer 83 can include a plurality of circuit layers 83. The plurality of circuit layers 83 can be longitudinally spaced apart from each other.

The inner vias 84 can be disposed between the plurality of circuit layers 83 for electrically connecting the plurality of circuit layers 83. In some embodiments, the inner vias 84 can extend through the dielectric layers 825. In some embodiments, the inner vias 84 can taper upward.

The first sealing structure 85 is embedded in the dielectric structure 82 (e.g., the plurality of dielectric layers 825). The first sealing structure 85 surrounds the at least one circuit layer 83 and the inner vias 84 to prevent the at least one circuit layer 83 and the inner vias 84 from being corroded by moisture.

The at least one bonding pad 86 is electrically connected to the at least one circuit layer 83 through one of the inner vias 84. In some embodiments, a bottom surface 861 of the at least one bonding pad 86 can be exposed from a bottom surface 821 of the dielectric structure 82.

The second sealing structure 87 is embedded in the dielectric structure 82 (e.g., the plurality of dielectric layers 825). The second sealing structure 87 surrounds the at least one bonding pad 86 to prevent the at least one bonding pad 86 from being corroded by moisture. In some embodiments, a bottom surface 871 of the second sealing structure 87 can be exposed from the bottom surface 821 of the dielectric structure 82.

The at least one conductive pad 88 can be disposed between the first sealing structure 85 and the second sealing structure 87 for connecting the first sealing structure 85 and the second sealing structure 87. In some embodiments, the at least one conductive pad 88 can be, for example, aluminum (Al) pad.

In some embodiments, as shown in FIG. 1 and FIG. 2, the pick and place apparatus 1 can include a source storage location 11, a destination storage location 12, a temporary storage device 3, a controller 14 and a suction device 15. The source storage location 11 can be, for example, frame type die source. The source storage location 11 is configured to store the at least one semiconductor element 8. That is, the at least one semiconductor element 8 can be disposed on the source storage location 11. The destination storage location 12 can be, for example, wafer, die on wafer, chip on wafer on substrate (CoWoS), die on glue film, interposer or substrate. The destination storage location 12 is configured to receive the at least one semiconductor element 8.

The temporary storage device 3 can be disposed at a side of the source storage location 11 and is configured to position the at least one semiconductor element 8 if required. In some embodiments, as shown in FIG. 2, the temporary storage device 3 can be disposed between the source storage location 11 and the destination storage location 12.

In some embodiments, the temporary storage device 3 can include a platform 31, at least one optical detector 32, an optical camera 33 and a moving stage 34. The platform 31 is configured to place the at least one semiconductor element 8 to be positioned. In order to prevent the at least one semiconductor element 8 from being damaged by the platform 31, the platform 31 can include a non-metal material. In some embodiments, the platform 31 can have a top surface 311 facing the at least one semiconductor element 8 and a bottom surface 312 opposite to the top surface 311.

The at least one optical detector 32 is disposed below the platform 31 and configured to detect the position of the at least one semiconductor element 8 on the platform 31. In some embodiments, the at least one optical detector 32 can also be referred to as "lower optical detector." In some embodiments, the platform 31 can include a transparent material. Thus, a detecting light $R_1$ (FIG. 9) of the at least one optical detector 32 can penetrate the platform 31 to arrive the at least one semiconductor element 8. In some embodiments, the at least one optical detector 32 can be, for example, infrared ray (IR) detector. In some embodiments, the at least one optical detector 32 can include a plurality of optical detectors 32.

The optical camera 33 is disposed below the platform 31 and corresponds to the at least one semiconductor element 8. In some embodiments, the optical camera 33 can also be referred to as "lower optical camera." The optical camera 33 is configured to capture an image of the at least one semiconductor element 8. The captured image can assist the at least one optical detector 32 to detect the position of the at least one semiconductor element 8. In some embodiments, an image light $R_2$ (FIG. 9) of the optical camera 33 can penetrate the platform 31 to arrive the at least one semiconductor element 8 when the platform 31 includes the transparent material.

The moving stage 34 is located below the platform 31 and configured to move the platform 31 for adjusting a position of the at least one semiconductor element 8. In some embodiments, the moving stage 34 can move the platform 31 horizontally or rotate the platform 31. In some embodiments, the moving stage can include a transparent material. Thus, the detecting light $R_1$ (FIG. 9) of the at least one optical detector 32 and the image light $R_2$ (FIG. 9) of the optical camera 33 can penetrate the moving stage 34 to arrive the at least one semiconductor element 8.

In some embodiments, as shown in FIG. 1, the controller 14 is configured to output or send a signal S to the suction device 15 after detecting an event. In some embodiments, the signal can be, for example, reset signal, alarm signal, or failure signal. The event can be, for example, earthquake, software failure, hardware failure, or power outage.

The suction device 15 is configured to pick and place the at least one semiconductor element 8. In some embodiments, the suction device 15 can transfer the at least one semiconductor element 8 from the source storage location 11 to the destination storage location 12. In some embodiments, the suction device 15 can transfer the at least one semiconductor element 8 from the source storage location 11 to the temporary storage device 3. In some embodiments, the suction device 15 can transfer the at least one semiconductor element 8 from the temporary storage device 3 to the destination storage location 12.

Figure 5:
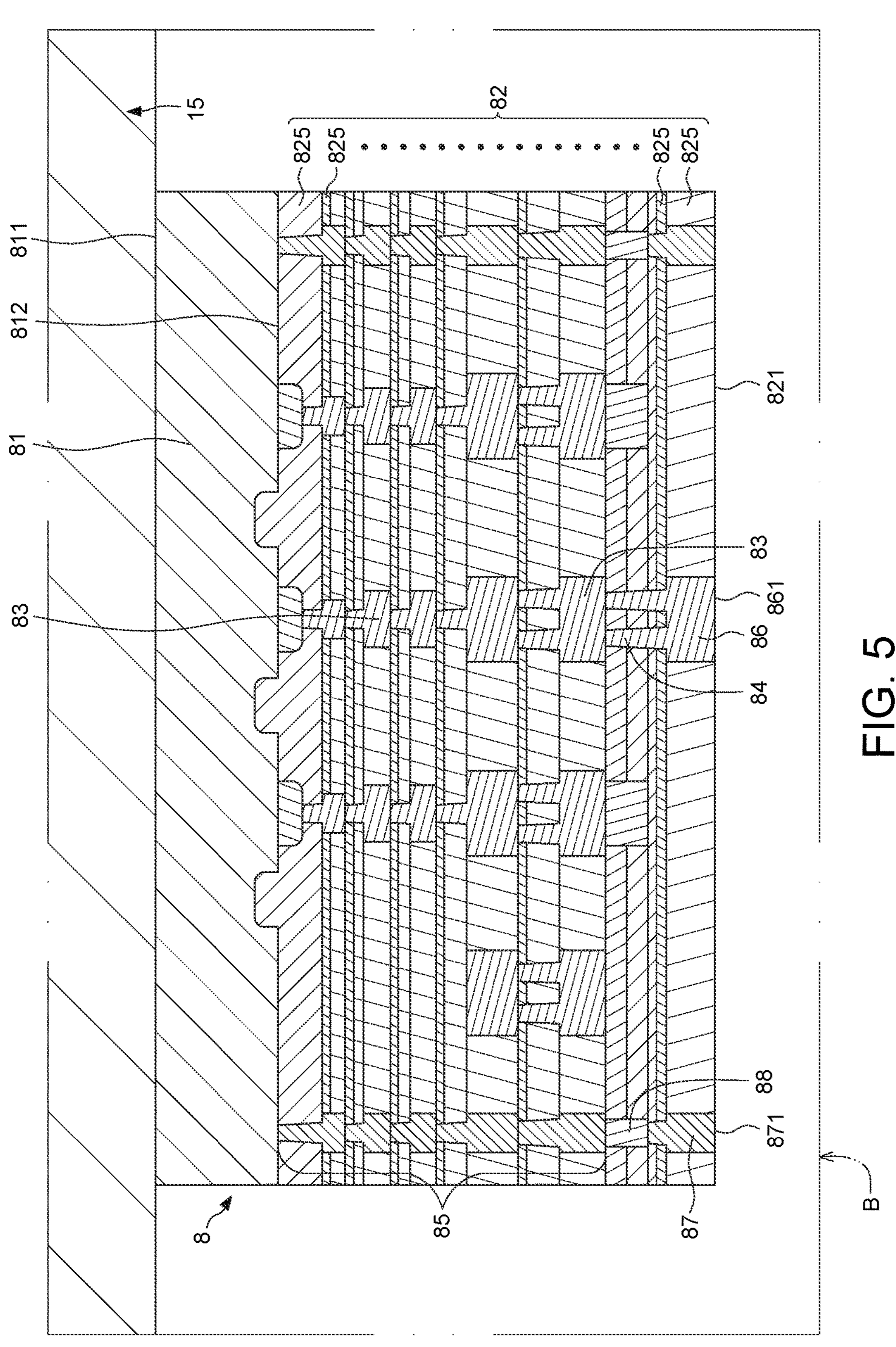
FIG. 5 illustrates an enlarged view of a region B of FIG. 4.

Referring to FIG. 4 and FIG. 5, the at least one semiconductor element 8 is picked up from the source storage location 11 by the suction device 15. In some embodiments, as shown in FIG. 5, the suction device 15 can contact the substrate 81 (e.g., the first surface 811) of the at least one semiconductor element 8.

Figure 6:
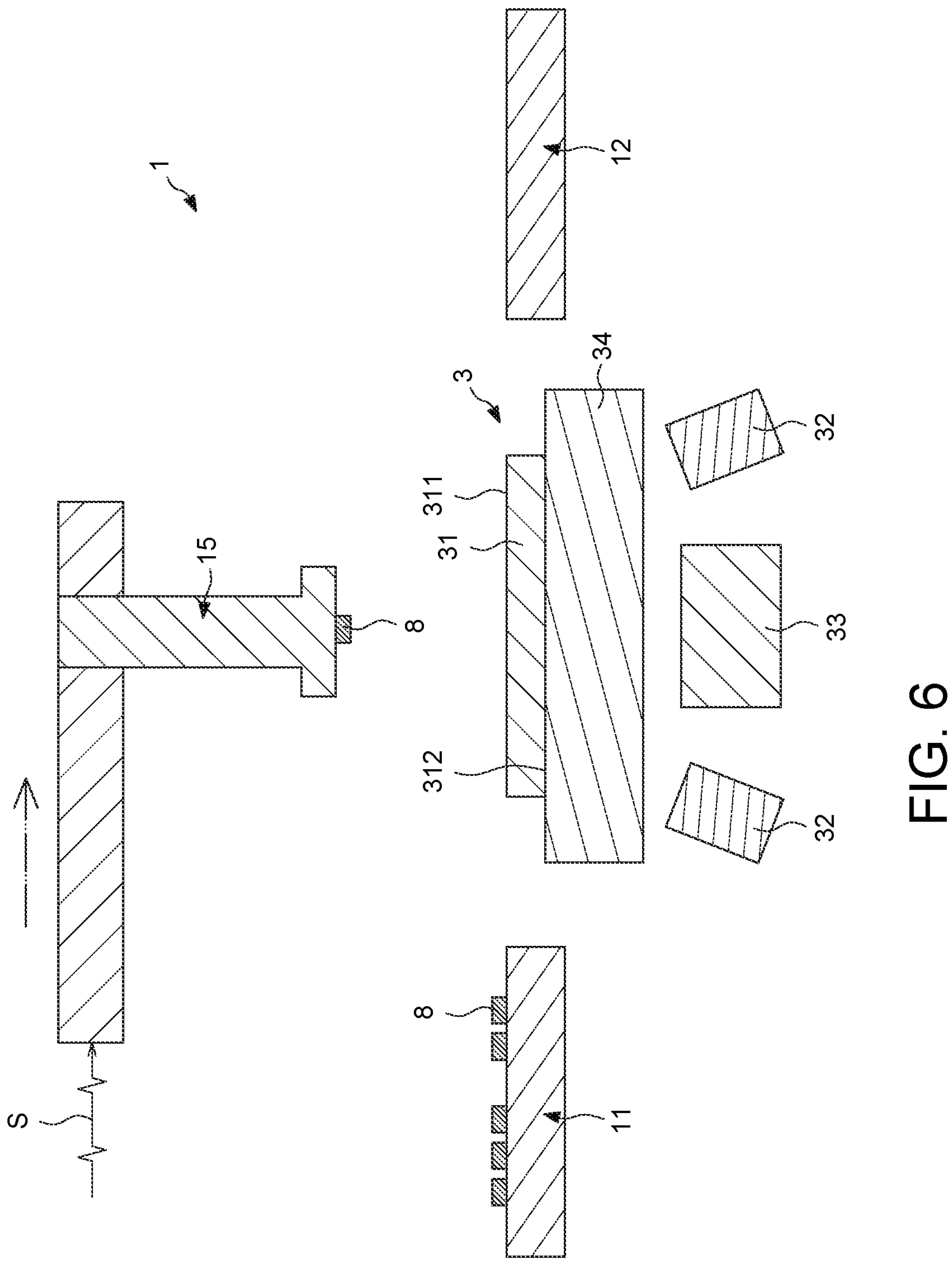
FIG. 6 illustrates a cross-sectional view of one or more stages of an example of a pick and place method according to some embodiments of the present disclosure.
Figure 7:
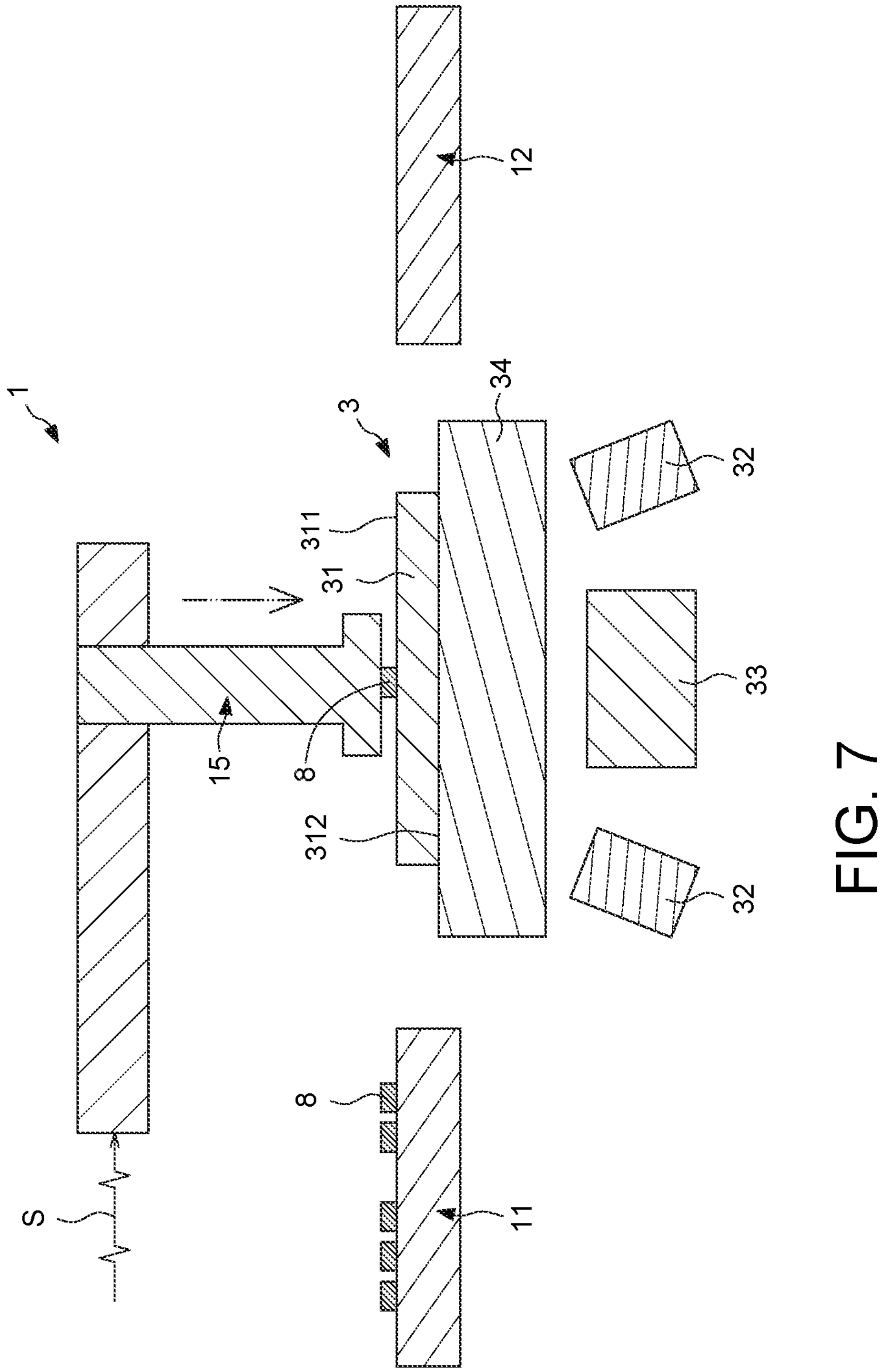
FIG. 7 illustrates a cross-sectional view of one or more stages of an example of a pick and place method according to some embodiments of the present disclosure.
Figure 8:
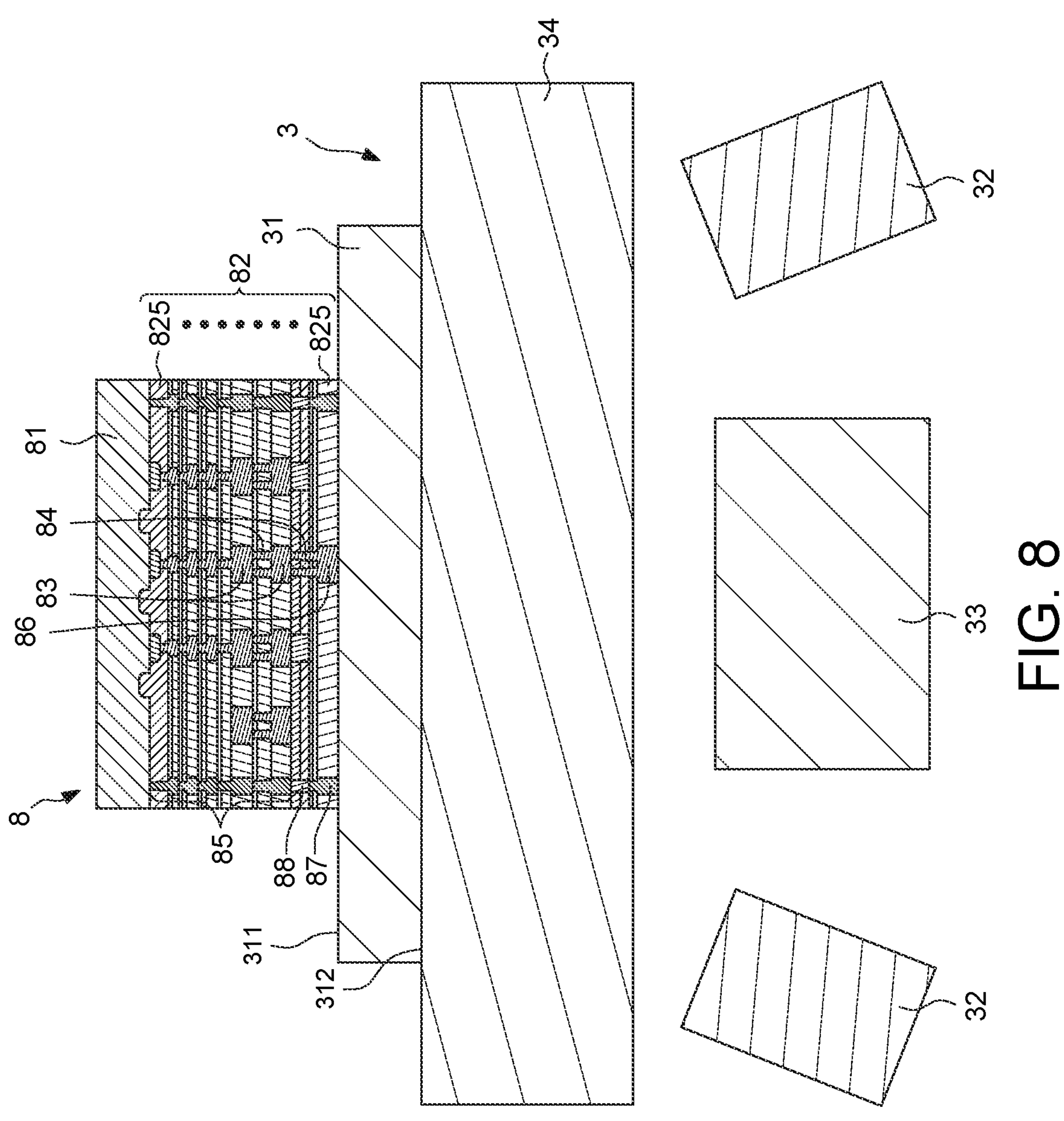
FIG. 8 illustrates a cross-sectional view of one or more stages of an example of a pick and place method according to some embodiments of the present disclosure.

Referring to FIG. 6 through FIG. 8, the at least one semiconductor element 8 is transferred to the temporary storage device 3 by the suction device 15 according to the signal S sent by the controller 14 after detecting the event. The at least one semiconductor element 8 can be placed on the platform 31. In some embodiments, the transfer operation of the at least one semiconductor element 8 can be acted immediately after the suction device 15 received the signal S. In this stage, the suction device 15 does not need to be reset.

In some embodiments, as shown in FIG. 8, the substrate 81 is farther from the at least one optical detector 32 than the at least one circuit layer 83 is. Thus, the detecting light $R_1$ (FIG. 9) of the at least one optical detector 32 and the image light $R_2$ (FIG. 9) of the optical camera 33 cannot be blocked by the substrate 81. In some embodiments, the substrate 81 is also farther from the at least one optical detector 32 than the dielectric structure 82 is. In some embodiments, the substrate 81 is also farther from the at least one optical detector 32 than the inner via 84 is. In some embodiments, the substrate 81 is also farther from the at least one optical detector 32 than the first sealing structure 85 is. In some embodiments, the substrate 81 is also farther from the at least one optical detector 32 than the at least one bonding pad 86 is. In some embodiments, the substrate 81 is also farther from the at least one optical detector 32 than the second sealing structure 87 is. In some embodiments, the substrate 81 is also farther from the at least one optical detector 32 than the conductive pad 88 is. In some embodiments, the at least one bonding pad 86 and the second sealing structure 87 can be disposed adjacent to the platform 31. In some embodiments, as shown in FIG. 8, the at least one bonding pad 86 and the second sealing structure 87 can contact the platform 31 (e.g., the top surface 311). In some embodiments, the bottom surface 861 of the at least one bonding pad 86 and the bottom surface 871 of the second sealing structure 87 can be substantially coplanar with the top surface 311 of the platform 31.

Figure 9:
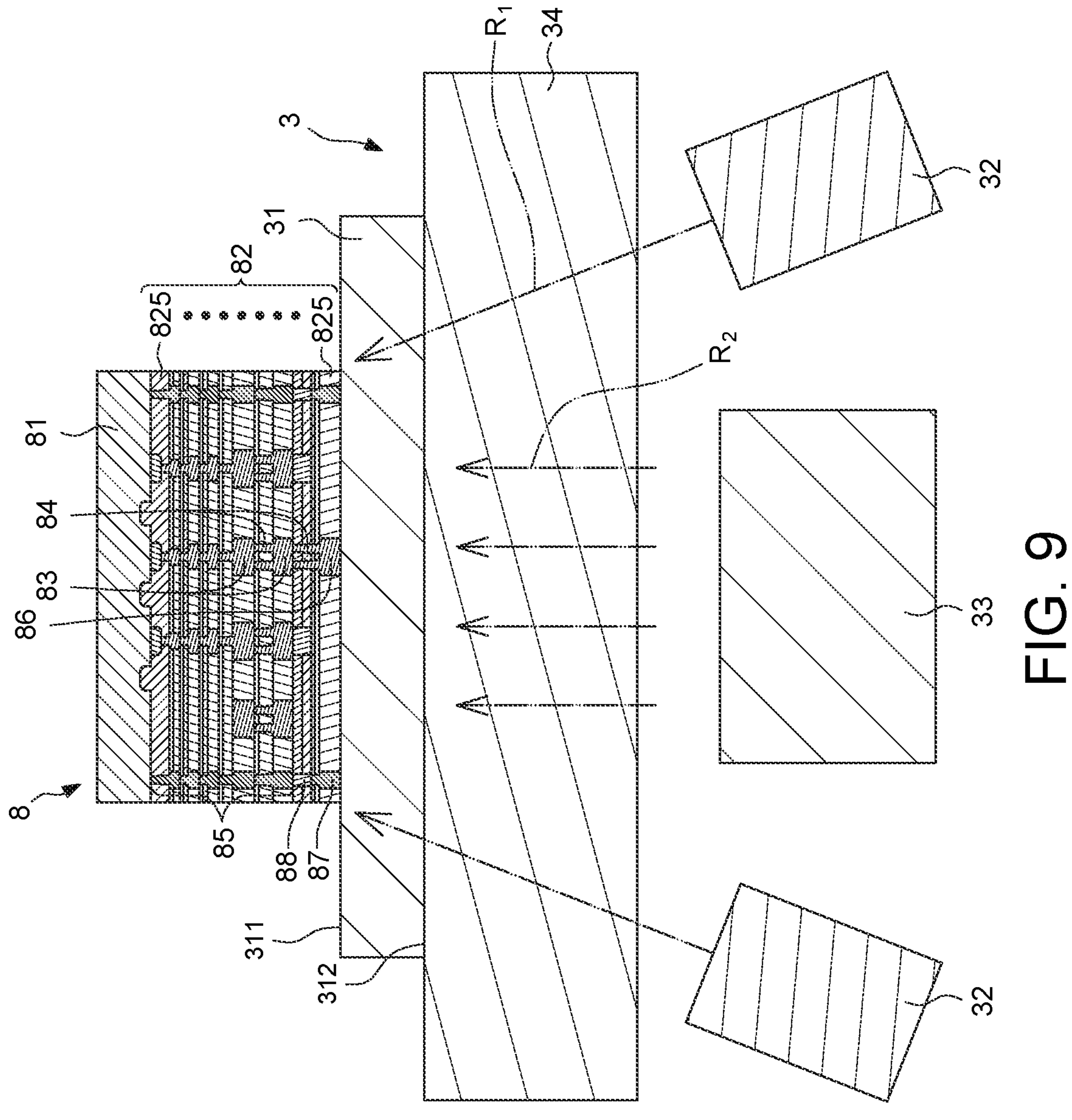
FIG. 9 illustrates a cross-sectional view of one or more stages of an example of a pick and place method according to some embodiments of the present disclosure.

Referring to FIG. 9, the at least one semiconductor element 8 is positioned via the temporary storage device 3. In some embodiments, the image of the at least one semiconductor element 8 can be captured from below the platform 31 by the image light $R_2$ of the optical camera 33, and the position of the at least one semiconductor element 8 can be detected from below the platform 31 by the detecting light $R_1$ of the at least one optical detector 32. According to the detected position of the at least one semiconductor element 8, the moving stage 34 can move or rotate the platform 31 to adjust the position of the at least one semiconductor element 8. Thus, the at least one semiconductor element 8 can be accurately realigned.

In some embodiments, a position of the suction device 15 can be adjusted according to the position of the at least one semiconductor element 8. That is, the position of the suction device 15 can be moved or rotated to match the position of the at least one semiconductor element 8, allowing for realignment. Thus, the moving stage 34 can be omitted.

Figure 10:
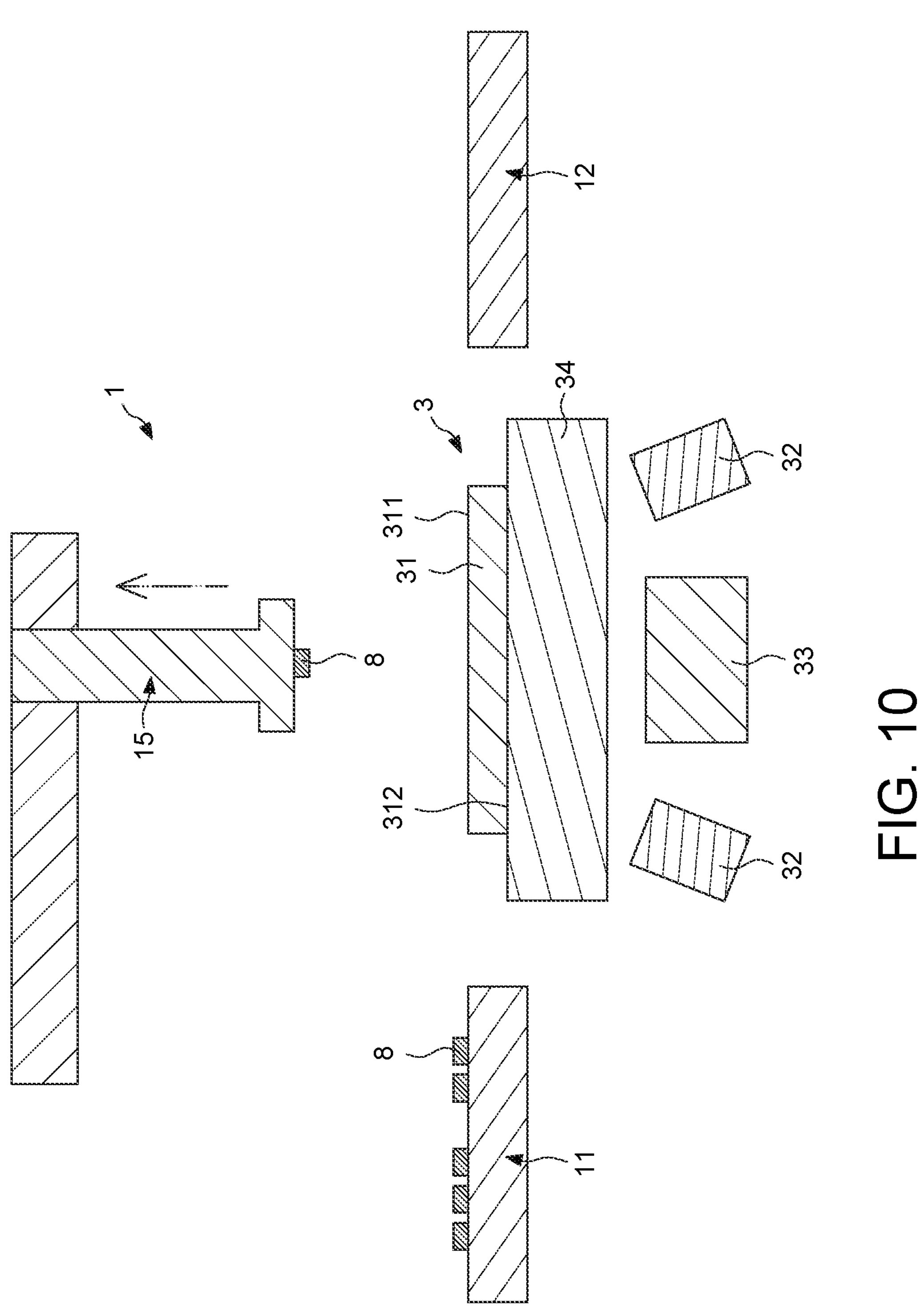
FIG. 10 illustrates a cross-sectional view of one or more stages of an example of a pick and place method according to some embodiments of the present disclosure.
Figure 11:
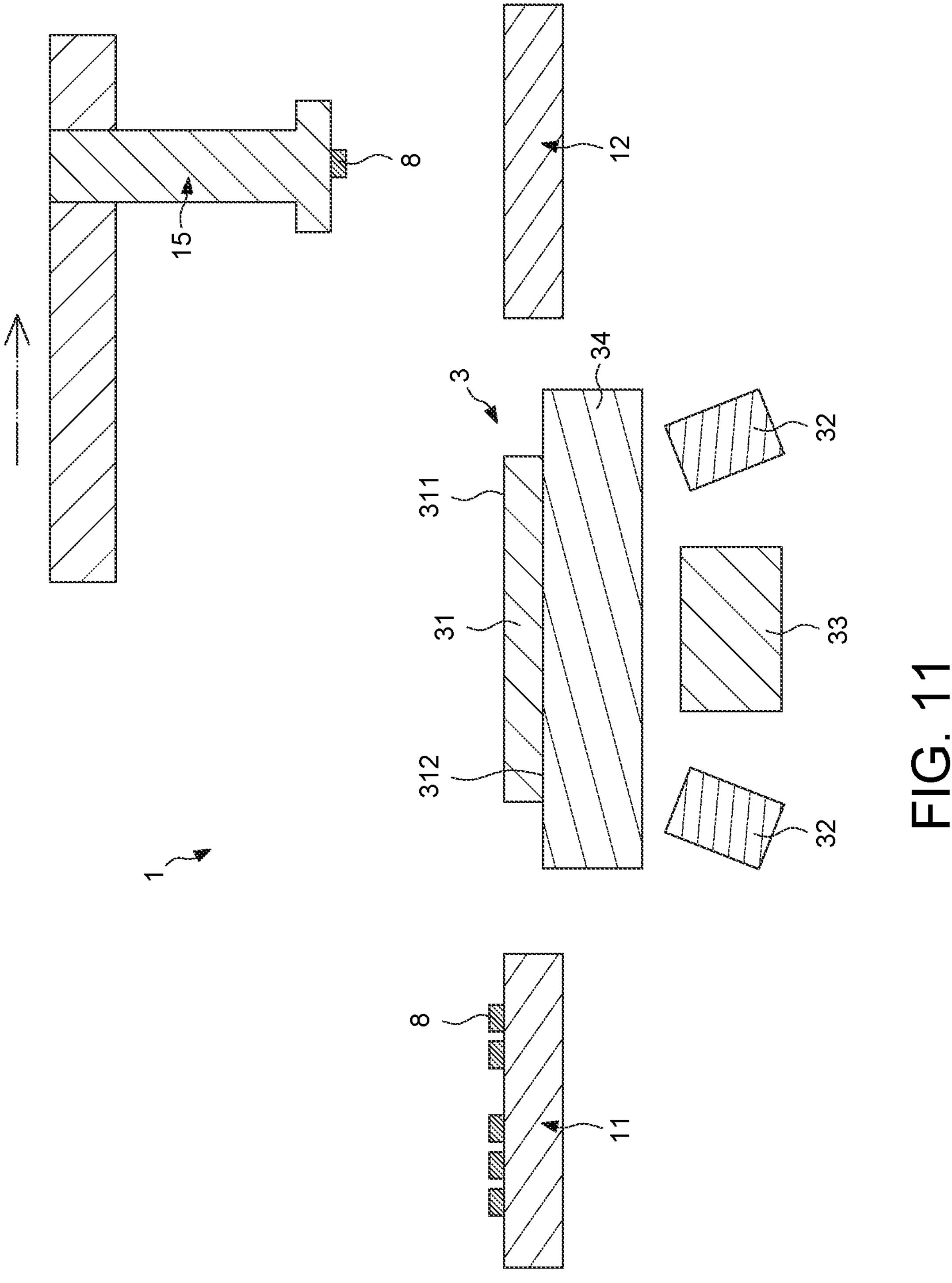
FIG. 11 illustrates a cross-sectional view of one or more stages of an example of a pick and place method according to some embodiments of the present disclosure.
Figure 12:
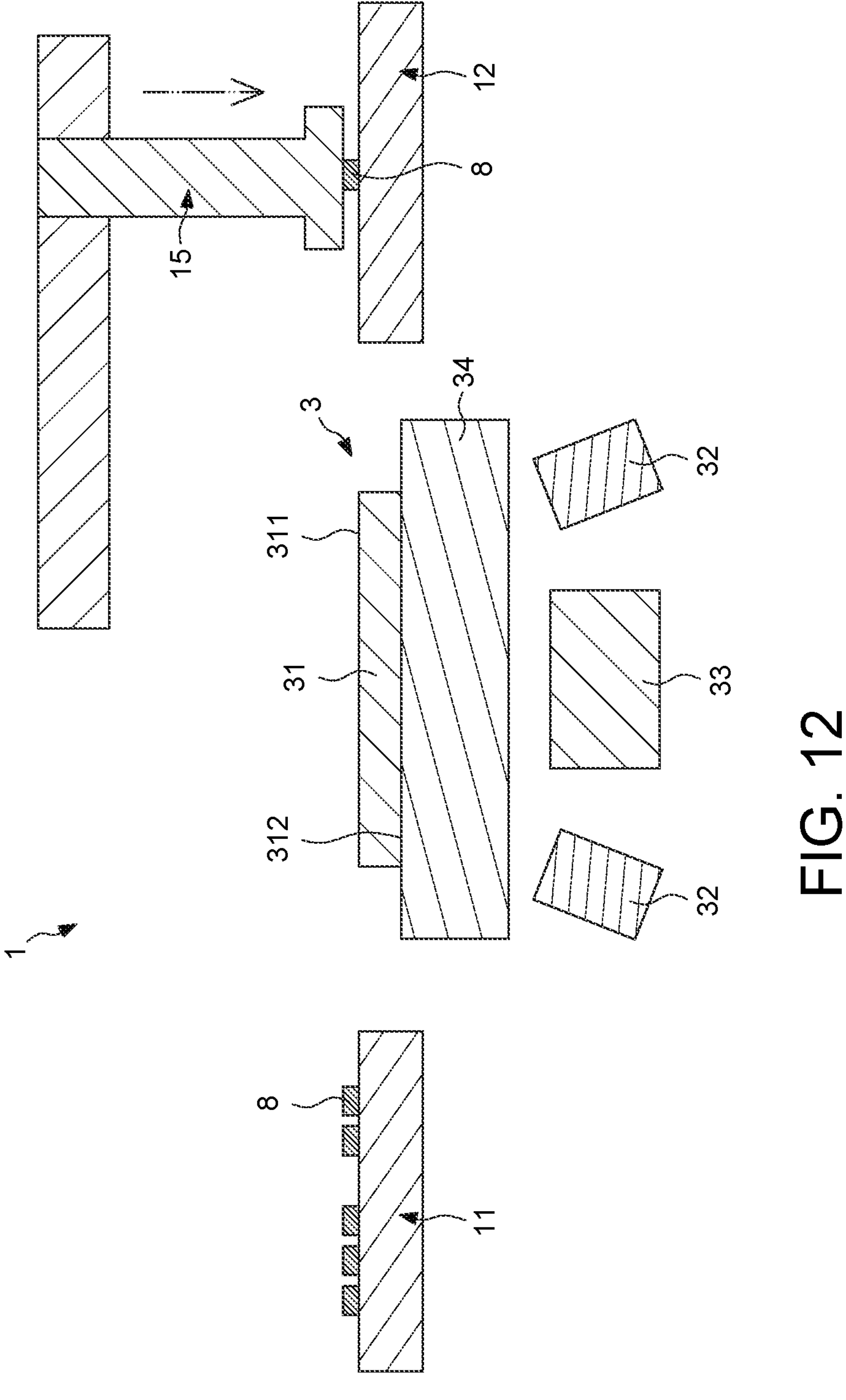
FIG. 12 illustrates a cross-sectional view of one or more stages of an example of a pick and place method according to some embodiments of the present disclosure.

Referring to FIG. 10 through FIG. 12, the positioned semiconductor element 8 is picked up from the temporary storage device 3 by the suction device 15. Then, the positioned semiconductor element 8 is placed on the destination storage location 12 by the suction device 15 to proceed subsequent processes.

The method of the present disclosure can be applied in hybrid die-to-die bonding processes; however, the disclosure is not limited thereto. As shown in the embodiments illustrated in FIG. 1 through FIG. 12, when the event (e.g., earthquake, software failure, hardware failure, or power outage) is detected, the at least one semiconductor element 8 on the suction device 15 can be transferred to the temporary storage device 3 for positioning and realignment. Thus, the at least one semiconductor element 8 on the suction device 15 does not need to be scrapped, resulting in increased manufacturing yield.

Figure 13:
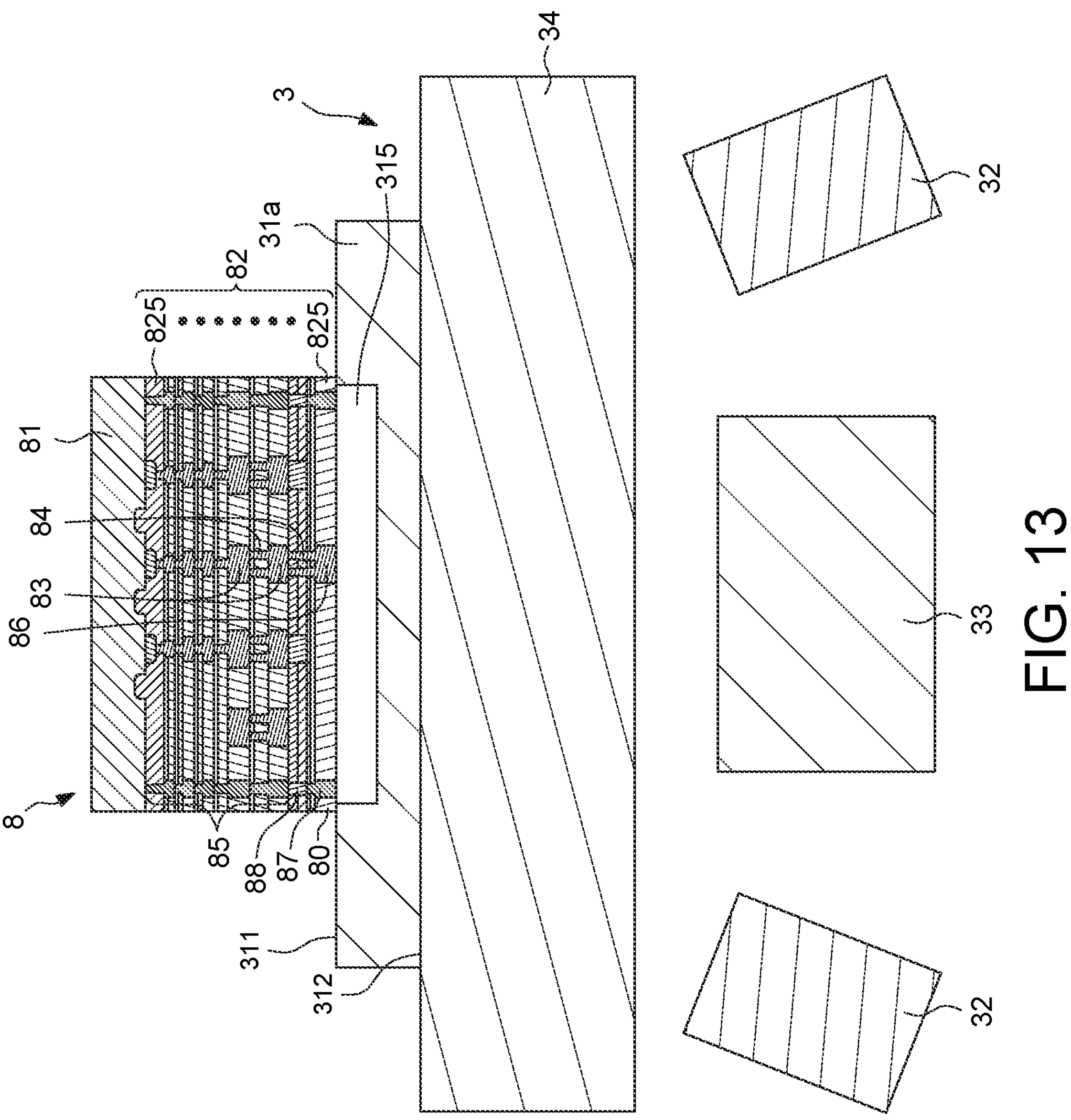
FIG. 13 illustrates a cross-sectional view of one or more stages of an example of a pick and place method according to some embodiments of the present disclosure.

FIG. 13 illustrates a cross-sectional view of one or more stages of an example of a pick and place method according to some embodiments of the present disclosure. The stage illustrated in FIG. 13 is the same as, or similar to, the stage illustrated in FIG. 8, except for a structure of the platform 31*a*. In some embodiments, as shown in FIG. 13, the platform 31*a* can include a cavity 315 recessed from the top surface 311. An edge 80 of the at least one semiconductor element 8 can be misaligned with the cavity 315. That is, the at least one semiconductor element 8 contacts the platform 31*a* only through the edge 80 to prevent the at least one semiconductor element 8 from being damaged by the platform 31*a*. In some embodiments, the at least one bonding pad 86 and the second sealing structure 87 can be located above the cavity 315 to prevent the at least one bonding pad 86 and the second sealing structure 87 from being damaged by the platform 31*a*. In some embodiments, the at least one circuit layer 83 and the inner vias 84 can be located in an upward projection area of the cavity 315.

Figure 14:
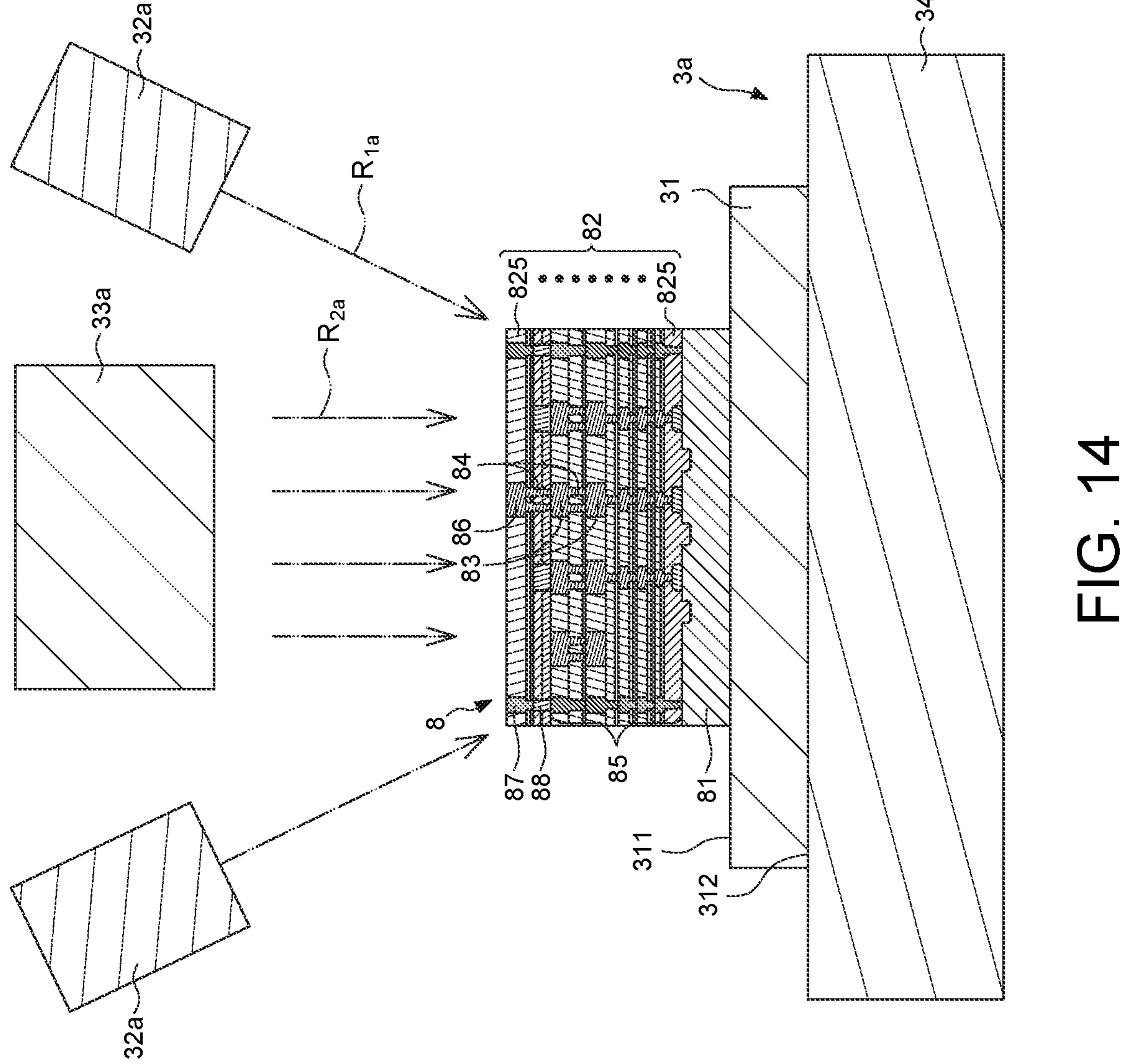
FIG. 14 illustrates a cross-sectional view of one or more stages of an example of a pick and place method according to some embodiments of the present disclosure.

FIG. 14 illustrates a cross-sectional view of one or more stages of an example of a pick and place method according to some embodiments of the present disclosure. The stage illustrated in FIG. 14 is the same as, or similar to, the stage illustrated in FIG. 9, except for positions of the at least one optical detector 32*a* and the optical camera 33*a* of the temporary storage device 3*a*. In some embodiments, as shown in FIG. 14, the at least one optical detector 32*a* and the optical camera 33*a* are disposed above the platform 31. Thus, the at least one optical detector 32*a* can also be referred to as "upper optical detector." The optical camera 33*a* can also be referred to as "upper optical camera." In some embodiments, the image of the at least one semiconductor element 8 can be captured from above the platform 31 by the image light $R_{2a}$ of the optical camera 33*a*, and the position of the at least one semiconductor element 8 can be detected from above the platform 31 by the detecting light Ria of the at least one optical detector 32*a*.

In some embodiments, as shown in FIG. 14, the substrate 81 can contact the platform 31. That is, the substrate 81 is farther from the at least one optical detector 32*a* than the at least one circuit layer 83 is. Thus, the detecting light $R_{1a}$ of the at least one optical detector 32*a* and the image light $R_{2a}$ of the optical camera 33*a* cannot be blocked by the substrate 81. In some embodiments, the substrate 81 is more adjacent to the platform 31 than the dielectric structure 82 is. In some embodiments, the substrate 81 is more adjacent to the platform 31 than the inner via 84 is. In some embodiments, the substrate 81 is more adjacent to the platform 31 than the first sealing structure 85 is. In some embodiments, the substrate 81 is more adjacent to the platform 31 than the at least one bonding pad 86 is. In some embodiments, the substrate 81 is more adjacent to the platform 31 than the second sealing structure 87 is. In some embodiments, the substrate 81 is more adjacent to the platform 31 than the conductive pad 88 is.

Figure 15:
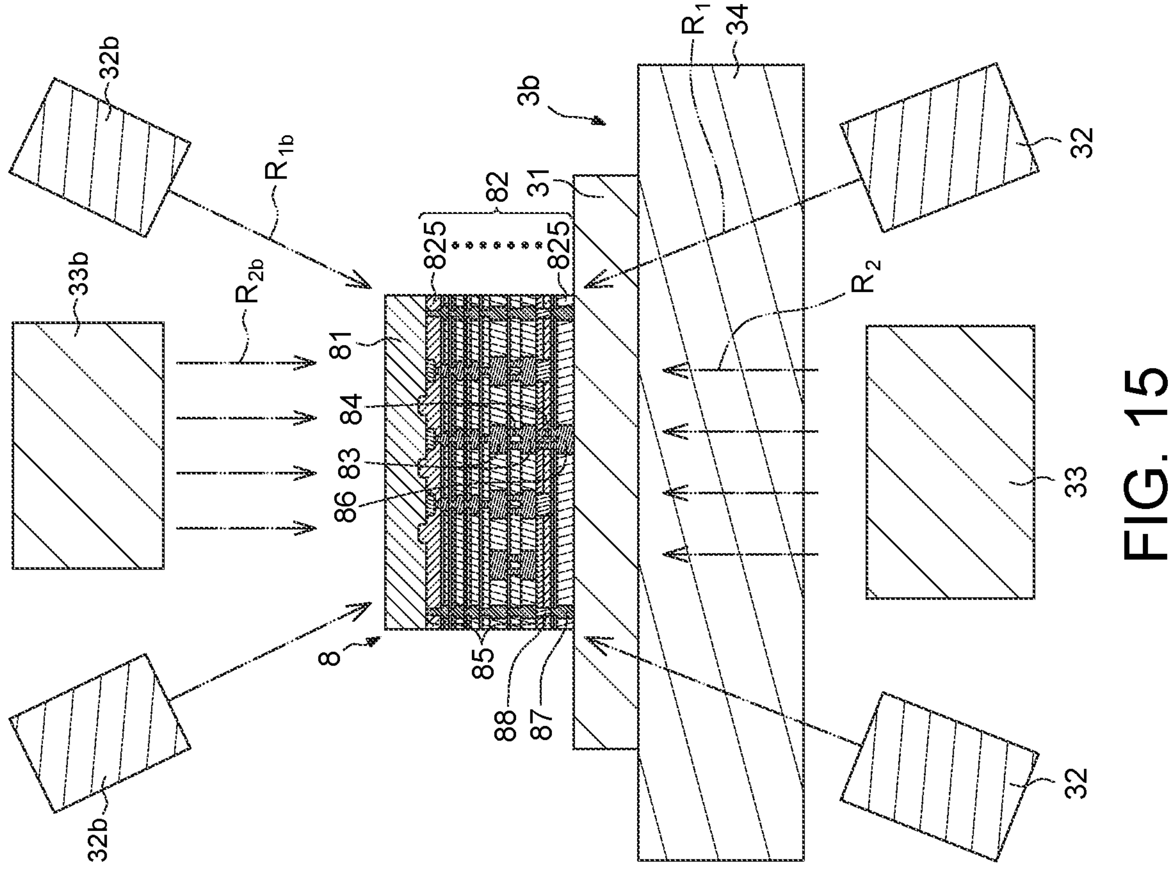
FIG. 15 illustrates a cross-sectional view of one or more stages of an example of a pick and place method according to some embodiments of the present disclosure.

FIG. 15 illustrates a cross-sectional view of one or more stages of an example of a pick and place method according to some embodiments of the present disclosure. The stage illustrated in FIG. 15 is the same as, or similar to, the stage illustrated in FIG. 9, except that the temporary storage device 3*b* further includes at least one upper optical detector 32*b* and an upper optical camera 33*b*. In some embodiments, as shown in FIG. 15, the at least one upper optical detector 32*b* and the upper optical camera 33*b* are disposed above the platform 31. In some embodiments, the image of the at least one semiconductor element 8 can be captured from above the platform 31 by the image light $R_{2b}$ of the upper optical camera 33*b*, and the position of the at least one semiconductor element 8 can be detected from above the platform 31 by the detecting light Rib of the at least one upper optical detector 32*b*. The optical detector 32 and the optical camera 33 of FIG. 15 can be the same as the optical detector 32 and the optical camera 33 of FIG. 9. Thus, the image of the at least one semiconductor element 8 can also be captured from below the platform 31 by the image light $R_2$ of the optical camera 33, and the position of the at least one semiconductor element 8 can also be detected from below the platform 31 by the detecting light $R_1$ of the optical detector 32.

To ensure the detecting light Rib of the at least one upper optical detector 32*b* and the image light $R_{2b}$ of the upper optical camera 33*b* can penetrate the substrate 81, the at least one upper optical detector 32*b* can be, for example, infrared ray (IR) detector. The upper optical camera 33*b* can be, for example, infrared ray (IR) camera.

Figure 16:
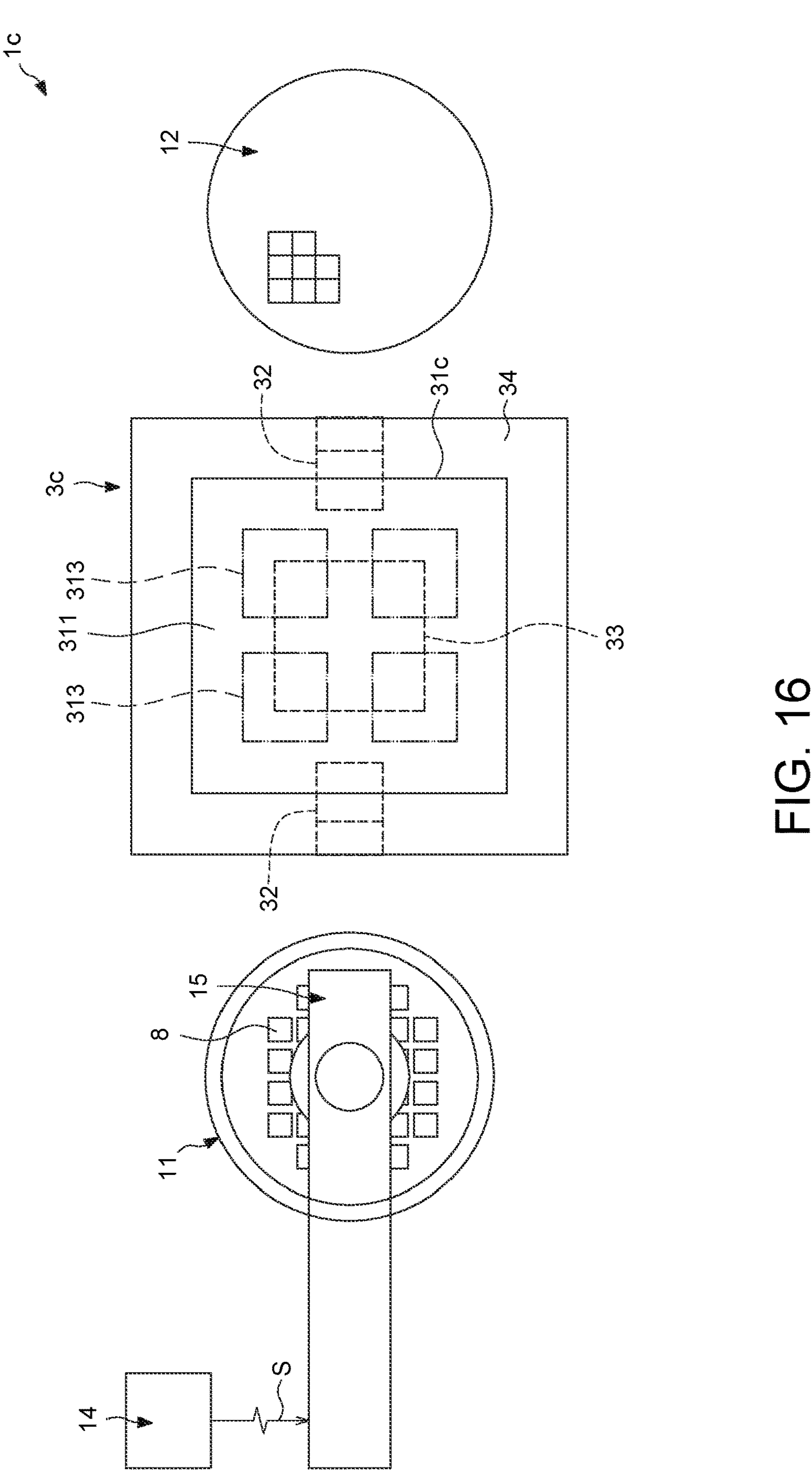
FIG. 16 illustrates a cross-sectional view of one or more stages of an example of a pick and place method according to some embodiments of the present disclosure.

FIG. 16 illustrates a cross-sectional view of one or more stages of an example of a pick and place method according to some embodiments of the present disclosure. The stage illustrated in FIG. 16 is the same as, or similar to, the stage illustrated in FIG. 1, except for a configuration of the temporary storage device 3*c* of the pick and place apparatus 1*c*. In some embodiments, as shown in FIG. 16, the top surface 311 of the platform 31*c* can have a plurality of areas 313 configured to place a plurality of semiconductor elements 8. The plurality of areas 313 can be spaced apart from each other. In some embodiments, the plurality of areas 313 can have the same size to place the plurality of semiconductor elements 8 of the same size. In some embodiments, the plurality of areas 313 can have different sizes to place the plurality of semiconductor elements 8 of the different sizes.

Figure 17:
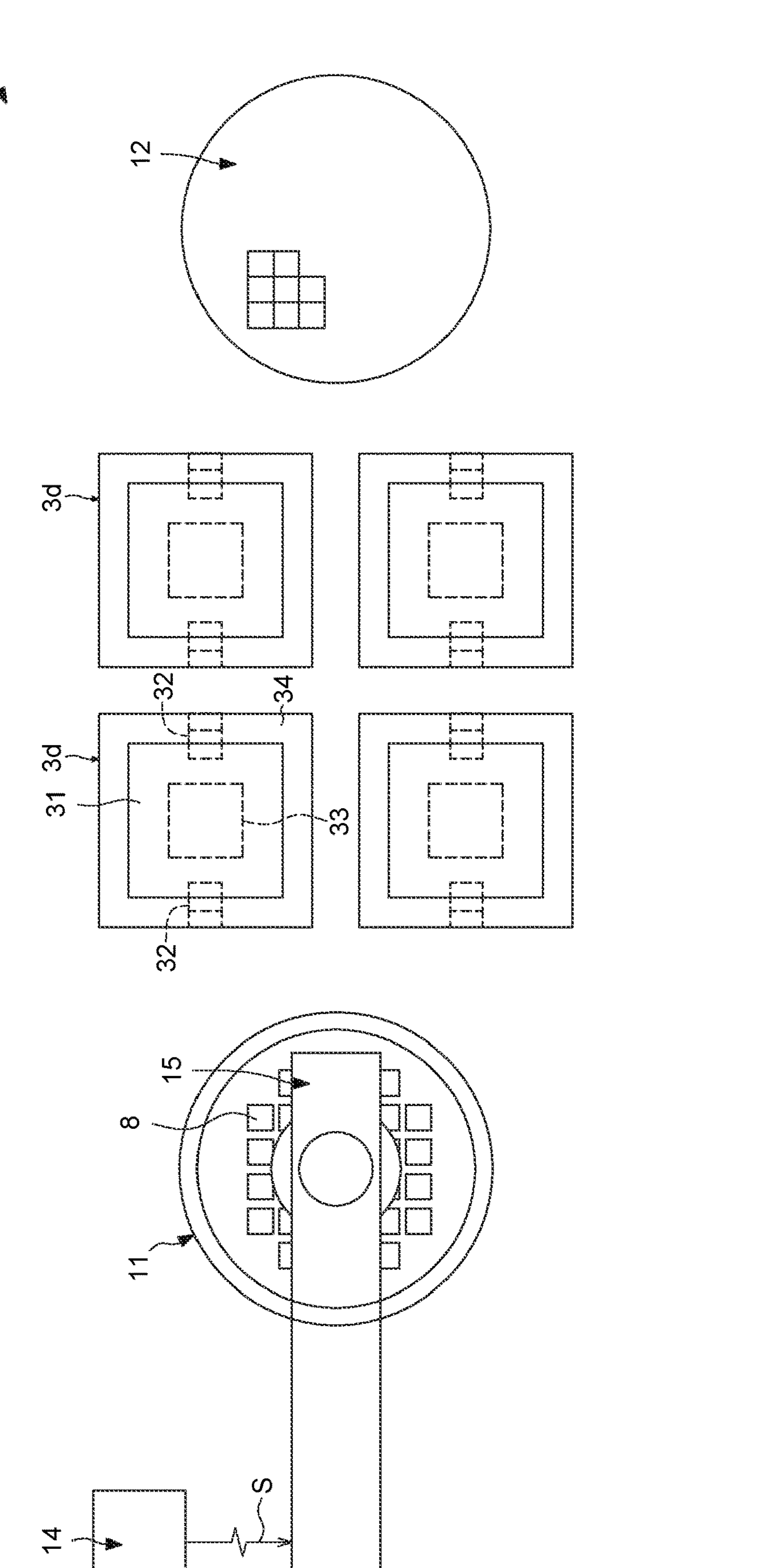
FIG. 17 illustrates a cross-sectional view of one or more stages of an example of a pick and place method according to some embodiments of the present disclosure.

FIG. 17 illustrates a cross-sectional view of one or more stages of an example of a pick and place method according to some embodiments of the present disclosure. The stage illustrated in FIG. 17 is the same as, or similar to, the stage illustrated in FIG. 1, except for an amount of the temporary storage device 3*d* of the pick and place apparatus 1*d*. In some embodiments, as shown in FIG. 17, the pick and place apparatus 1*d* can include a plurality of temporary storage devices 3*d* configured to position a plurality of semiconductor elements 8. The plurality of temporary storage devices 3*d* can be spaced apart from each other. In some embodiments, the plurality of temporary storage devices 3*d* of FIG. 17 can be the same as the temporary storage device 3 of FIG. 1.

Figure 18:
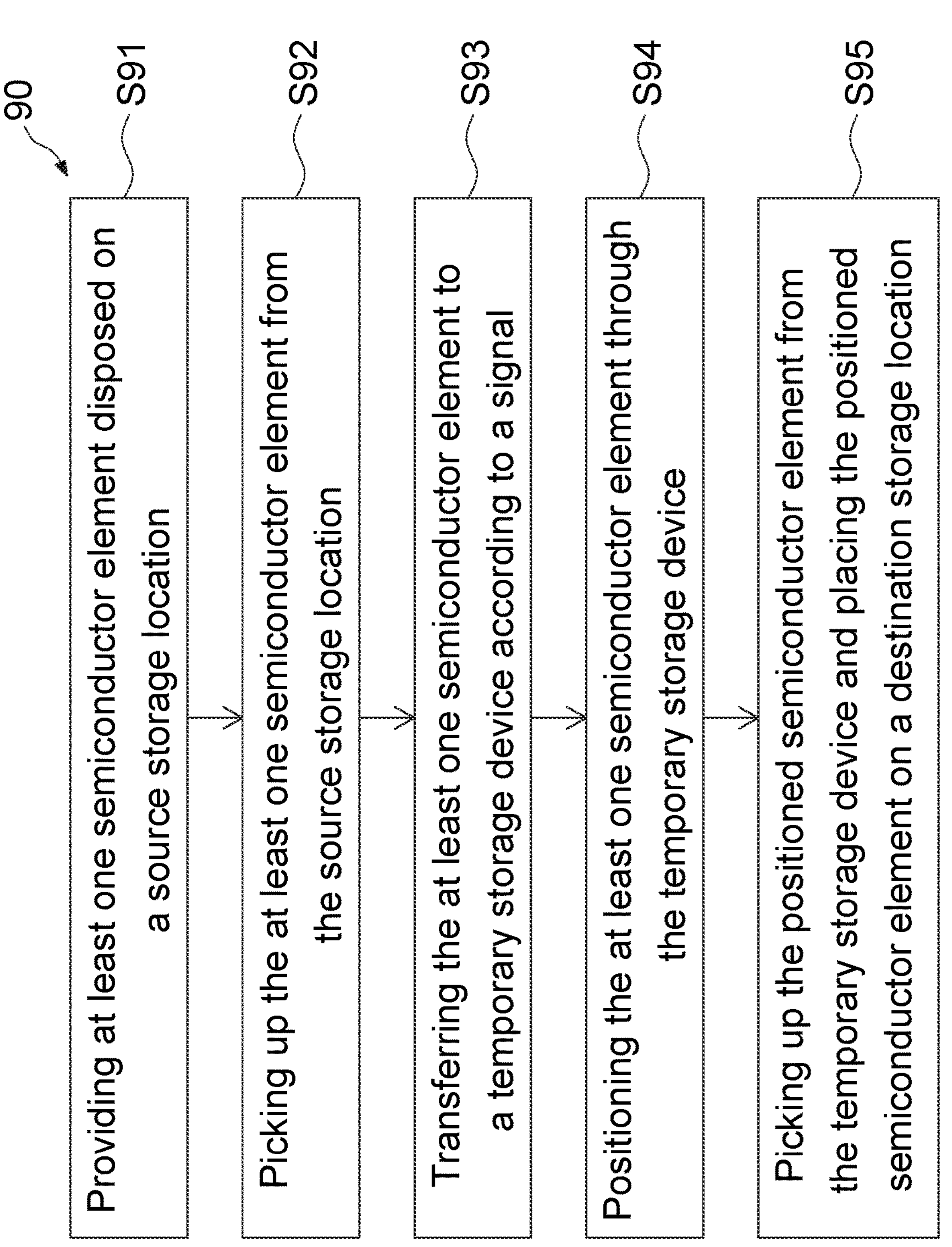
FIG. 18 illustrates a flow chart of a pick and place method according to some embodiments of the present disclosure.

FIG. 18 illustrates a flow chart of a pick and place method 90 according to some embodiments of the present disclosure.

In some embodiments, the pick and place method 90 can include a step S91, providing at least one semiconductor element disposed on a source storage location. For example, as shown in FIG. 1 and FIG. 2, the at least one semiconductor element 9 is provided. The at least one semiconductor element 9 is disposed on the source storage location 11.

In some embodiments, the pick and place method 90 can include a step S92, picking up the at least one semiconductor element from the source storage location. For example, as shown in FIG. 4 and FIG. 5, the at least one semiconductor element 8 is picked up from the source storage location 11.

In some embodiments, the pick and place method 90 can include a step S93, transferring the at least one semiconductor element to a temporary storage device according to a signal. For example, as shown in FIG. 6 through FIG. 8, the at least one semiconductor element 8 is transferred to the temporary storage device 3 according to the signal S.

In some embodiments, the pick and place method 90 can include a step S94, positioning the at least one semiconductor element via the temporary storage device. For example, as shown in FIG. 9, the at least one semiconductor element 8 is positioned at the temporary storage device 3.

In some embodiments, the pick and place method 90 can include a step S95, picking up the positioned semiconductor element from the temporary storage device and placing the positioned semiconductor element on a destination storage location. For example, as shown in FIG. 10 through FIG. 12, the positioned semiconductor element 8 is picked up from the temporary storage device 3. Then, the positioned semiconductor element 8 is placed on the destination storage location 12.

In accordance with some embodiments of the present disclosure, a pick and place method includes: providing at least one semiconductor element disposed on a source storage location; picking up the at least one semiconductor element from the source storage location; transferring the at least one semiconductor element to a temporary storage device according to a signal; positioning the at least one semiconductor element via the temporary storage device; and picking up the positioned semiconductor element from the temporary storage device and placing the positioned semiconductor element on a destination storage location. The signal is sent by a controller after detecting an event.

In accordance with some embodiments of the present disclosure, a pick and place method includes: picking up at least one semiconductor element by a suction device; sending a signal to the suction device after detecting an event; and placing the at least one semiconductor element on a temporary storage device according to the signal.

In accordance with some embodiments of the present disclosure, a pick and place apparatus includes a source storage location, a destination storage location, a temporary storage device, a controller and a suction device. The source storage location is configured to store at least one semiconductor element. The destination storage location is configured to receive the at least one semiconductor element. The temporary storage device is disposed at a side of the source storage location and configured to position the at least one semiconductor element. The controller is configured to send a signal after detecting an event. The suction device is configured to pick and place the at least one semiconductor element and transfers the at least one semiconductor element to the temporary storage device according to the signal sent by the controller. The temporary storage device includes a platform and at least one optical detector. The platform is configured to place the at least one semiconductor element. The at least one optical detector is configured to position the at least one semiconductor element. The at least one semiconductor element includes a substrate, a dielectric structure located over a surface of the substrate and at least one circuit layer embedded in the dielectric structure. The substrate is farther from the at least one optical detector than the at least one circuit layer is. The at least one optical detector is disposed below the platform. The platform has a surface facing the at least one semiconductor element and includes a cavity recessed from the surface. An edge of the at least one semiconductor element is misaligned with the cavity. The temporary storage device further includes an optical camera disposed below the platform. The optical camera is configured to capture an image of the at least one semiconductor element. The temporary storage device further includes a moving stage located below the platform. The moving stage is configured to move the platform for adjusting a position of the at least one semiconductor element.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pick and place method, comprising:

(a) providing at least one semiconductor element disposed on a source storage location;

(b) picking up the at least one semiconductor element from the source storage location;

(c) transferring the at least one semiconductor element to a temporary storage device according to a signal, wherein the temporary storage device includes a platform having a cavity recessed from a top surface of the platform;

(d) positioning the at least one semiconductor element over the cavity of the temporary storage device, an edge of a bottom surface of the at least one semiconductor element is disposed on the top surface of the platform, such that the bottom surface of the at least one semiconductor element extends across the cavity and is spaced apart from a bottom surface of the cavity by a recessing depth of the cavity to prevent the bottom surface of the at least one semiconductor element from being damaged by the platform; and (e) picking up the positioned semiconductor element from the temporary storage device and placing the positioned semiconductor element on a destination storage location.

2. The pick and place method of claim 1, wherein the signal is sent by a controller after detecting an event.

3. The pick and place method of claim 1, wherein the temporary storage device further includes at least one optical detector; wherein in (c), the at least one semiconductor element is placed on the platform; and (d) comprises:

(d1) detecting a position of the at least one semiconductor element from below the platform using the at least one optical detector.

4. The pick and place method of claim 3, wherein after (d1), the method further comprises:

(d2) adjusting the position of the at least one semiconductor element.

5. The pick and place method of claim 3, wherein in (b), the at least one semiconductor element is picked up by a picked-up head, and after (d1), the method further comprises:

(d2) adjusting a position of the picked-up head according to the position of the at least one semiconductor element.

6. The pick and place method of claim 3, wherein the temporary storage device further includes an optical camera corresponding to the at least one semiconductor element, and (d1) comprises:

(d11) capturing an image of the at least one semiconductor element from below the platform using the optical camera.

7. The pick and place method of claim 6, wherein in (d11), an image light of the optical camera penetrates the platform to arrive the at least one semiconductor element.

8. The pick and place method of claim 3, wherein in (d1), a detecting light of the at least one optical detector penetrates the platform to arrive the at least one semiconductor element.

9. The pick and place method of claim 1, wherein the temporary storage device further includes at least one optical detector; wherein in (c), the at least one semiconductor element is placed on the platform; and (d) comprises:

(d1) detecting a position of the at least one semiconductor element from above the platform using the at least one optical detector.

10. The pick and place method of claim 9, wherein the temporary storage device further includes an optical camera corresponding to the at least one semiconductor element, and (d1) comprises:

(d11) capturing an image of the at least one semiconductor element from above the platform using the optical camera.

11. A pick and place method, comprising:

(a) picking up at least one semiconductor element by a picked-up head, wherein the at least one semiconductor element comprises a circuit layer over a substrate and a bonding pad on the circuit layer;

(b) sending a signal to the picked-up head after detecting an event; and (c) placing the at least one semiconductor element on a temporary storage device according to the signal, wherein the temporary storage device includes a platform having a cavity recessed from a top surface of the platform, and the at least one semiconductor element is placed on the top surface of the platform and over the cavity, such that a bottom surface of the at least one semiconductor element extends across the cavity, and the bonding pad is spaced apart from a bottom surface of the cavity by at least a depth of the cavity.

12. The pick and place method of claim 11, wherein the signal is a reset signal, an alarm signal, or a failure signal.

13. The pick and place method of claim 11, wherein after (c), the method further comprises:

(d) positioning the at least one semiconductor element via the temporary storage device.

14. The pick and place method of claim 13, wherein the temporary storage device further includes at least one optical detector; wherein in (c), the at least one semiconductor element is placed on the platform; and (d) comprises:

(d1) detecting a position of the at least one semiconductor element from below the platform using the at least one optical detector.

15. The pick and place method of claim 14, wherein the temporary storage device further includes a moving stage located below the platform, and after (d1), the method further comprises:

(d2) moving the platform to adjust the position of the at least one semiconductor element by the moving stage.

16. The pick and place method of claim 13, wherein the temporary storage device further includes at least one optical detector; wherein in (c), the at least one semiconductor element is placed on the platform; and (d) comprises:

(d1) detecting a position of the at least one semiconductor element from above the platform using the at least one optical detector.

17. The pick and place method of claim 11, wherein the event is earthquake, software failure, hardware failure, or power outage.

18. A pick and place method, comprising:

(a) picking up the at least one semiconductor element by a picked-up head;

(b) sending a signal to the picked-up head after detecting an event;

(c) transferring the at least one semiconductor element to a temporary storage device according to a signal, wherein the temporary storage device includes a platform having a cavity recessed from a top surface of the platform;

(d) positioning the at least one semiconductor element on the top surface of the platform and over the cavity according to a detection result of a position of the at least one semiconductor element, such that a bottom surface of the at least one semiconductor element extends across the cavity and is spaced apart from a bottom surface of the cavity by a vertical distance between the top surface of the platform and the bottom surface of the cavity; and (e) picking up and transferring the positioned semiconductor element by the picked-up head to a destination storage location.

19. The pick and place method of claim 18, wherein in (d), the at least one semiconductor element is positioned by placing a circuit layer and inner vias of the at least one semiconductor element within an upward projection area of the cavity.

20. The pick and place method of claim 18, wherein (d) comprises:

(d1) detecting the position of the at least one semiconductor element from below the platform using at least one optical detector.

* * * * *